United States Patent [19]
Cheung et al.

[11] Patent Number: 5,843,836
[45] Date of Patent: Dec. 1, 1998

[54] TUNNELING TECHNOLOGY FOR REDUCING INTRA-CONDUCTIVE LAYER CAPACITANCE

[75] Inventors: Robin W. Cheung, Cupertino; Simon S. Chan, Saratoga; Richard J. Huang, Milpitas, all of Calif.

[73] Assignee: Advanced Micro Devices, Inc., Sunnyvale, Calif.

[21] Appl. No.: 744,655

[22] Filed: Nov. 6, 1996

Related U.S. Application Data

[60] Continuation of Ser. No. 512,421, Aug. 8, 1995, abandoned, which is a division of Ser. No. 391,692, Feb. 21, 1995, Pat. No. 5,670,828.

[51] Int. Cl.$^6$ .................................................. H01L 21/441
[52] U.S. Cl. ........................ 438/626; 438/668; 438/700
[58] Field of Search .................................. 438/626, 632, 438/668, 760, 761, 782, 700

[56] References Cited

U.S. PATENT DOCUMENTS

| | | |
|---|---|---|
| 3,841,031 | 10/1974 | Walsh . |
| 3,911,562 | 10/1975 | Youmans . |
| 4,193,226 | 3/1980 | Gill, Jr. et al. . |
| 4,811,522 | 3/1989 | Gill, Jr. . |
| 4,944,836 | 7/1990 | Beyer et al. . |
| 4,986,878 | 1/1991 | Malazgirt et al. ................... 156/643.1 |
| 4,987,101 | 1/1991 | Kaanta et al. ........................... 437/228 |
| 5,164,334 | 11/1992 | Mizushima .............................. 437/203 |
| 5,245,794 | 9/1993 | Salugsugan . |
| 5,302,233 | 4/1994 | Kim et al. ............................. 156/636.1 |
| 5,310,700 | 5/1994 | Lien et al. .............................. 437/195 |
| 5,407,860 | 4/1995 | Stoltz et al. ............................ 437/180 |
| 5,413,962 | 5/1995 | Lur et al. ................................ 437/195 |
| 5,444,015 | 8/1995 | Aitken et al. .......................... 437/182 |
| 5,461,003 | 10/1995 | Havemann et al. .................... 437/187 |
| 5,517,062 | 5/1996 | Lur et al. . |
| 5,670,828 | 9/1997 | Cheung et al. . |

FOREIGN PATENT DOCUMENTS

| | | |
|---|---|---|
| A-0373360 | 6/1990 | European Pat. Off. . |
| A-0494745 | 7/1992 | European Pat. Off. . |

OTHER PUBLICATIONS

S. Wolf et al "Silicon Processing for the VLSI Era vol. I" Lattice Press, Calif. (1986) pp. 540 and 559 and 532–533.

S Wolf "Silicon Processing for the VLSI Era vol. 2" Lattice Press Calif (1990) p. 234.

Primary Examiner—Caridad Everhart

[57] ABSTRACT

The control speed of semiconductor circuitry is increased by forming air tunnels in the interwiring spaces of a conductive pattern to reduce intra-conductive layer capacitance.

29 Claims, 3 Drawing Sheets

TUNNELING TECHNOLOGY FOR REDUCING INTRA-CONDUCTIVE LAYER CAPACITANCE

This application is a continuation of application Ser. No. 08/512,421 filed Aug. 8, 1995, abandoned which is a division of application Ser. No. 08/391,692 filed Feb. 21, 1995 U.S. Pat. No. 5,670,828.

TECHNICAL FIELD

The present invention relates to a semiconductor device comprising conductive patterns with reduced capacitance, and to a method for forming the reduced capacitance conductive patterns. The invention has particular application in submicron circuit manufacturing.

BACKGROUND ART

The escalating requirements for density and performance associated with ultra large scale integration semiconductor wiring require responsive changes in interconnection technology, which is considered one of the most demanding aspects of ultra large scale integration technology. High density demands for ultra large scale integration semiconductor wiring require planarized layers with minimal spacing between conductive wiring lines, i.e., an interwiring spacing less than about 1 micron. In addition, high performance microprocessor applications require rapid control speed of semiconductor circuitry. The control speed of semiconductor circuitry varies inversely with the resistance and capacitance of the conductive pattern. Accordingly, some prior art efforts to increase the control speed of semiconductor circuitry focused upon reducing the resistance of the conductive pattern. Conventional metallization patterns are typically formed by depositing a layer of conductive material, notably aluminum or an alloy thereof, and etching. Prior art efforts to reduce the resistance of the conductive pattern involve utilizing conductive materials other than aluminum, e.g., copper or silver.

Other prior art efforts to increase the control speed of semiconductor circuitry focused upon reducing the dielectric constant of the materials conventionally deposited on a conductive pattern and filling the interwiring spaces, such as silicon dioxide, which has a dielectric constant of about 4. Prior efforts involved the development and/or use of new materials having a low dielectric constant such as low dielectric constant polymers, Teflon, aerogels, and porous polymers. For example, polyimides generally exhibit a dielectric constant of about 2.4 to about 3.9, Teflon exhibits a dielectric constant of about 1.6 to about 2.2, and aerogels generally exhibit a dielectric constant of slightly below about 2. It is, however, highly desirable to further reduce the dielectric constant of the conductive pattern in order to attain a higher control speed of a semiconductor circuit to meet increasing requirements.

DISCLOSURE OF THE INVENTION

An object of the present invention is a semiconductor device comprising a conductive pattern having a very low dielectric constant.

Another object of the invention is a method for manufacturing a semiconductor device comprising a conductive pattern having a very low dielectric constant.

Additional objects and other features of the invention will be set forth in part in the description which follows and in part will become apparent to those having ordinary skill in the art upon examination of the following or may be learned from the practice of the invention. The objects and advantages of the invention may be realized and attained as particularly pointed out in the appended claims.

According to the present invention, the foregoing and other objects are achieved in part by a semiconductor device comprising: a substrate; an insulating layer formed on the substrate; and a conductive pattern formed on the insulating layer; wherein the conductive pattern comprises conductive lines separated by interwiring spaces, and a plurality of the interwiring spaces contain air forming air tunnels in the interwiring spaces.

Another aspect of the invention is a method of manufacturing a semiconductor device comprising: forming an insulating layer on a substrate; forming a conductive pattern on the insulating layer, wherein the conductive pattern comprises conductive lines separated by interwiring spaces; and forming air tunnels in a plurality of the interwiring spaces.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE INVENTION

Figure 1:
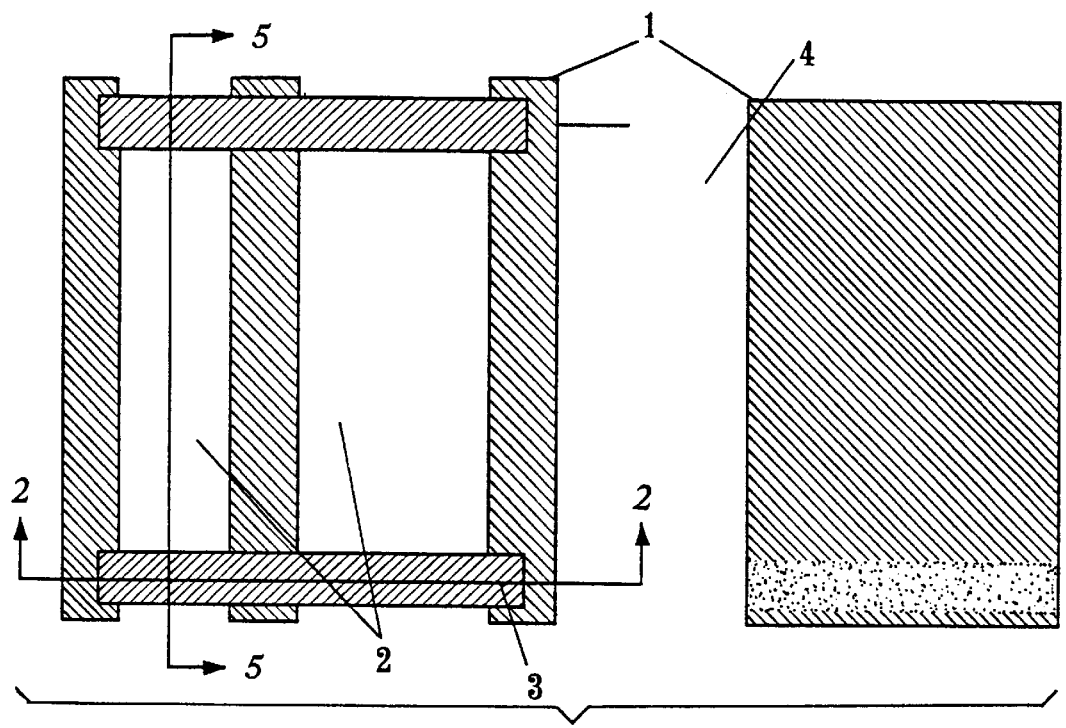
FIG. 1 schematically illustrates a top view of a tunnel mask positioned on a conductive pattern.

The semiconductor device produced in accordance with the present invention exhibits a very high control speed by virtue of reduced intra-conductive layer capacitance. Preferably, the capacitance of the conductive pattern is substantially reduced. This is achieved by filling a plurality of the interwiring spaces with air to form air tunnels. Since air has a dielectric constant of 1, the capacitance of portions of the conductive pattern containing air tunnels is substantially reduced.

In accordance with the present invention, an insulating layer is formed on a semiconductor substrate, such as silicon, and a conductive pattern comprising conductive lines separated by interwiring spaces is formed on the insulating layer. According to conventional practices, the interwiring spaces of the conductive pattern are filled with a dielectric material, such as silicon dioxide, or a material with a lower dielectric constant than silicon dioxide, such as a low dielectric constant polymer. However, in accordance with the present invention, the interwiring spaces are filled with air, which has a dielectric constant of 1. Thus, the present invention comprises filling a portion of the interwiring spaces with air to form air tunnels in the interwiring spaces, so that the portions of the conductive pattern containing air tunnels exhibit a substantially reduced dielectric constant. Preferably, the portion of the interwiring spaces provided with air tunnels has an interwiring spacing less than about 1.0 micron. Portions of the conductive pattern having an interwiring spacing equal to or greater than 1.0 micron can be filled with any of the conventionally employed dielectric materials, such as silicon dioxide or a low dielectric constant polymer.

In a preferred embodiment of the present invention, air tunnels are formed in interwiring spaces between consecutive conductive lines. In a preferred aspect of this embodiment, a conductive pattern is formed comprising a plurality of separate sections containing air tunnels in interwiring spaces between consecutive conductive lines. Generally, the number of consecutive conductive lines is selected to achieve an optimum low dielectric constant in a particular situation, and generally ranges from about 2 to about 256, preferably about 64 consecutive conductive lines.

The semiconductor device of the present invention preferably comprises at least one layer of insulating material comprising a plurality of separate sections containing air tunnels in interwiring spaces between consecutive conductive lines, thereby achieving a reduced intra-conductive layer capacitance. Preferably, the distance between each section containing air tunnels in interwiring spaces between consecutive conductive lines is about 10 to about 100 microns, preferably about 20 microns.

In another preferred embodiment of the present invention, the semiconductor device comprises a plurality of layers of insulating material, wherein each layer has a conductive pattern thereon, and at least one conductive via forming an electrical connection between the conductive patterns of different layers. Preferably, a plurality of the layers of insulating material contain a conductive pattern with air tunnels in interwiring spaces between consecutive conductive lines.

In another preferred embodiment of the present invention, the interwiring spaces containing air tunnels comprise a dielectric liner on the conductive lines and either the substrate for the lowest (first) level or insulating layer for subsequent levels. The thickness of the dielectric liner is selected for optimum reduced capacitance, and generally ranges from about 500 Å to about 2500 Å. The dielectric liner can comprise any conventional dielectric material, preferably silicon dioxide. The dielectric liner can be formed by conventional deposition techniques, preferably plasma enhanced chemical vapor deposition (PECVD) or high density plasma (HDP) Chemical Vapor Deposition (CVD) techniques, such as Electron Cyclotron Resonance (ECR), Inductor Coupled Plasma (ICP), Transformer Coupled Plasma (TCP), Helicon plasma.

In accordance with the present invention, a capping layer is formed on the section of conductive wiring having air spaces to form the air tunnels. The thickness of the capping layer is also selected for optimum reduced capacitance, and generally ranges from about 1000 Å to about 2000 Å. The capping layer comprises a conventional dielectric material, preferably silicon dioxide. The capping layer can also be deposited by conventional deposition techniques, preferably PECVD.

The conductive pattern formed in the claimed invention can comprise any conductive material conventionally employed for forming conductive patterns in the semiconductor industry. Preferably, the conductive material comprises a member selected from the group consisting of refractory materials, such as titanium and titanium alloys, tungsten and tungsten alloys, aluminum, aluminum alloys, copper, copper alloys and polycrystalline silicon. The insulating material employed in the present invention can comprise any insulating material conventionally employed in the semiconductor industry for forming insulating layers. Preferably, the insulating material comprises a member selected from the group consisting of nitrides, oxides, oxynitrides, polyimides and polymeric materials.

The method employed in the present invention to produce a semiconductor device having reduced intra-conductive layer capacitance comprises forming an insulating layer on a substrate by a conventional deposition technique, such as (CVD) or by a spinning technique. A conductive pattern, preferably a metallization pattern, is then formed on the insulating layer in a conventional manner. For example, the metallization pattern is formed by depositing a metallization layer and patterning employing conventional photolithographic and etching techniques, preferably anisotropic etching, such as reactive ion etching. The metallization layer is deposited by any of various conventional metal deposition techniques, such as CVD processes including low pressure chemical vapor deposition (LPCVD) and PECVD, melting or sputtering.

A portion of the conductive pattern having an interwiring spacing of less than about 1.0 micron is selected for the formation of air tunnels. As schematically depicted in FIG. 1, conductive pattern 1 comprises a plurality of metal lines having interwiring spacings 2 of less than about 1 micron. It is not necessary to form air tunnels in interwiring spaces having a spacing, which equals or exceeds about 1 micron, such as that designated by the reference numeral 4. Accordingly, tunnel mask 3 is provided for etching the interwiring spaces of less than 1 micron.

Figure 2:
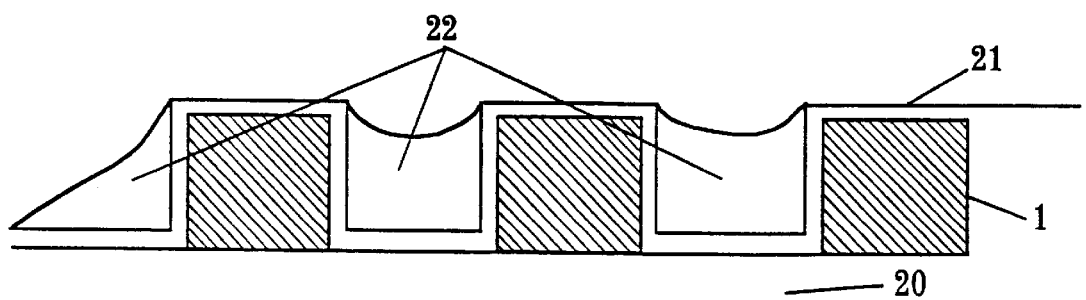
FIG. 2 schematically illustrates a cross-sectional view taken along line 2—2 of FIG. 1 at an initial stage of the inventive method.

As illustrated in FIG. 2, a dielectric liner 21 is applied on the conductive pattern 1 and substrate 20. The dielectric liner is a conventional dielectric material, preferably silicon dioxide. The thickness of the dielectric liner is selected to achieve an optimum low capacitance in a particular situation, and generally ranges from about 500 Å to about 2500 Å. Although the dielectric liner can be deposited by any conventional deposition technique, it is preferred to employ PECVD or HDPCVD. In a preferred aspect, the initial deposition of the dielectric liner is followed by sputter etching to prevent the formation of voids in the interwiring spaces. It has been found that sputter etching preferentially opens the interwiring spaces. Advantageously, the dielectric material is deposited in the interwiring spaces, subsequent to sputter etching, preferably by PECVD. The thickness of the deposited dielectric material is preferably about 1000 Å to about 2500 Å.

Subsequent to formation of the dielectric liner, spin on glass (SOG) is deposited to fill the interwiring spaces, and cured in a conventional manner. The deposited SOG is etched back to a desirable level, primarily to insure the absence of SOG in areas in which conductive vias are intended to be formed. SOG absorbs moisture and outgases during subsequent formation of conductive vias, thereby preventing adhesion of deposited conductive material, such as metal. It is, therefore, desirable to remove SOG from areas in which conductive vias are to be formed. An intermediate structure formed during the inventive process after etching back the SOG is schematically depicted in FIG. 2.

Figure 3:
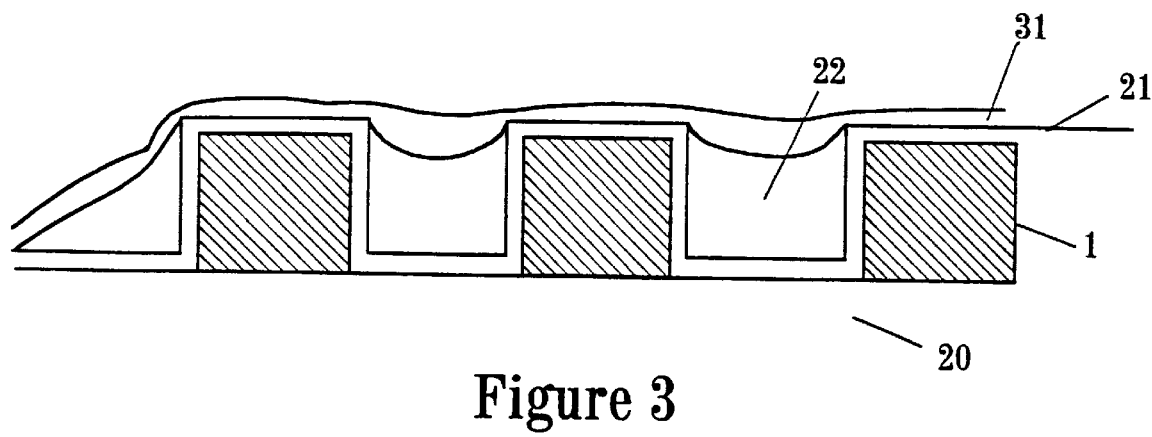
FIG. 3 schematically illustrates a cross-sectional view at a stage subsequent to that depicted in FIG. 2.

Subsequent to etching back the SOG, a capping layer 31, as shown in FIG. 3, is deposited on the conductive pattern extending across the dielectric liner and the interwiring spaces which are filled with SOG. The capping layer comprises a conventional dielectric material, such as silicon dioxide, and is preferably applied by PECVD. The thickness of the capping layer is selected for optimum reduced capacitance, and generally ranges from about 1000 Å to about 2000 Å.

An appropriate resist mask such as tunnel mask 3, shown in FIG. 1, is then formed which contains at least two holes for defining therebetween a section of the conductive pattern wherein air tunnels are to be formed. The tunnel mask is positioned over the capping layer, as on the surface of the intermediate structure shown in FIG. 3. The tunnel mask is preferably positioned over the section of the conductive pattern having an interwiring spacing less than about 1.0 micron. Dry anisotropic etching is then conducted, preferably reactive ion etching, through the mask to form at least two holes in the capping layer to define a section of the conductive pattern in which air tunnels are to be formed.

Figure 4:
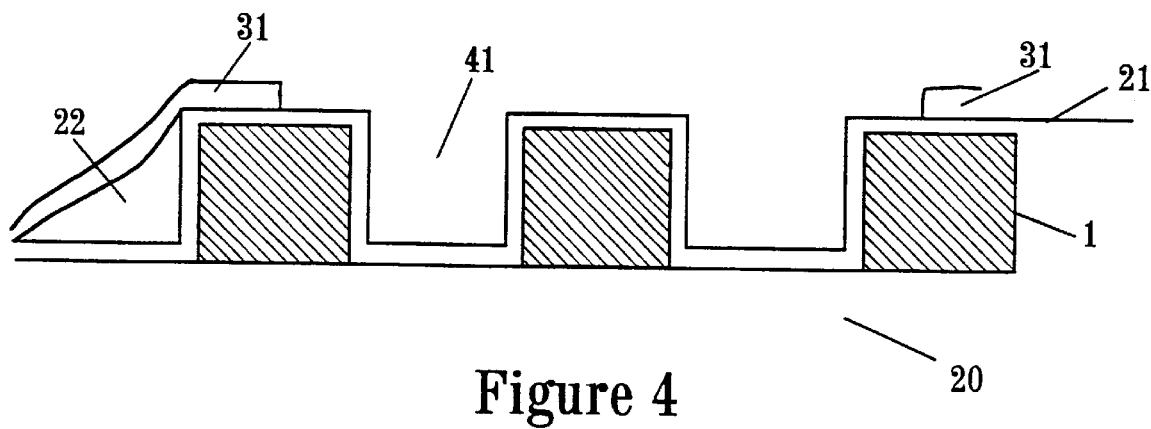
FIG. 4 schematically illustrates a cross-sectional view at a stage subsequent to that depicted in FIG. 3.
Figure 5:
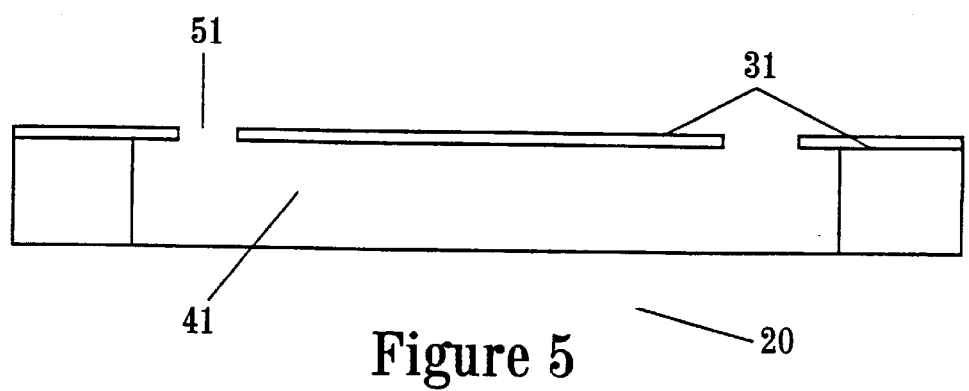
FIG. 5 schematically illustrates a cross-sectional view of a semiconductor device taken along line 5—5, of FIG. 1 at the stage depicted in FIG. 4.

After forming the holes by penetrating the capping layer, wet etching is conducted to preferentially attack and remove SOG from within the interwiring spaces. Wet etching is preferably conducted with a buffered hydrofluoric acid (HF) solution, preferably a dilute HF solution containing in excess of 130 parts of water per part of HF and 7 parts of ammonium fluoride. The buffered HF solution removes all of the SOG material and leaves the unetched capping layer and dielectric liner, thereby forming air tunnels 41 between the initially formed holes 51, as schematically depicted in FIGS. 4 and 5. In this manner, a section of the conductive pattern having an interwiring spacing less than 1 micron is provided with air tunnels thereby reducing the dielectric constant of the section to about 1.

Figure 6:
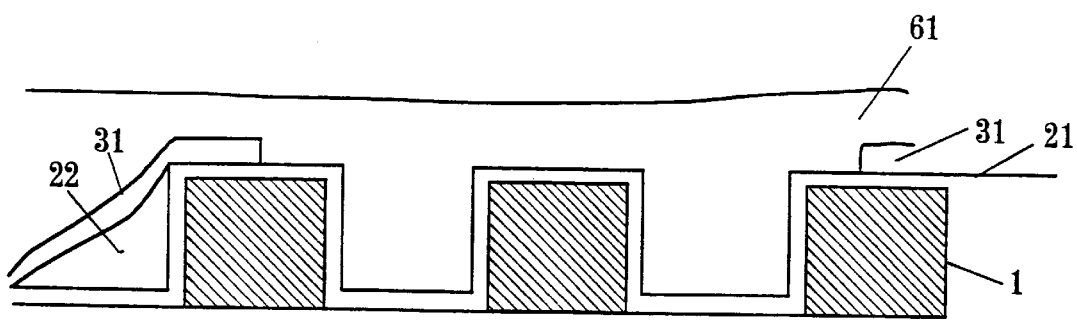
FIG. 6 schematically illustrates another cross-sectional view taken along line 2—2 of FIG. 1 subsequent to the stage depicted in FIG. 4.
Figure 7:
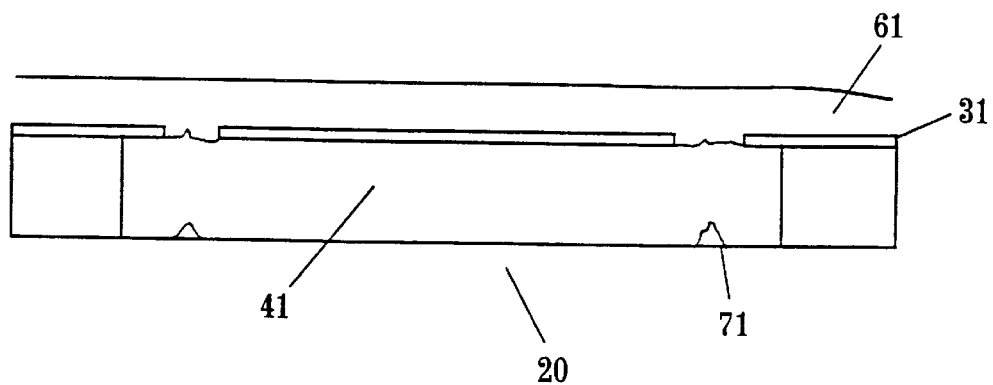
FIG. 7 schematically illustrates a cross-sectional view taken along line 5—5 of FIG. 1 upon completion of the air tunnel.

Subsequent to formation of the air tunnels, a capping layer 61 of dielectric material is deposited, preferably silicon dioxide, as schematically depicted in FIGS. 6 and 7. The capping layer is preferably deposited by PECVD. The thickness of the capping layer is also selected for optimum reduced capacitance, and is preferably about 2 microns. The capping layer encloses the openings through which the SOG material was removed by wet etching to complete the formation of air tunnels. The deposited capping layer is then planarized in a conventional manner, as by etching or chemical-mechanical polishing (CMP). CMP is a conventional technique as disclosed in, for example, Salugsugan, U.S. Pat. No. 5,245,794; Beyer et al., U.S. Pat. No. 4,944, 836 and Youmans, U.S. Pat. No. 3,911,562. U.S. Pat. No. 4,193,226 and U.S. Pat. No. 4,811,522 to Gill, Jr. and U.S. Pat. No. 3,841,031 to Walsh relate to CMP apparatus.

The resulting section of the conductive pattern having an interwiring spacing of less than 1 micron is characterized by a plurality of interwiring spaces having air tunnels as shown in FIG. 7, albeit a minor amount of dielectric material 71 may remain as a result of PECVD.

The semiconductor device manufactured in accordance with the present invention comprises a conductive pattern having at least one section exhibiting a substantially reduced dielectric constant with an interwiring spacing less than about 1 micron and air tunnels formed in the interwiring spaces. In another aspect, sections of the conductive pattern having an interwiring spacing equal to or greater than 1 are characterized by interwiring spaces filled with a low dielectric constant material, such as silicon dioxide or a low dielectric constant polymeric material.

In another embodiment of the present invention, the dielectric liner 21 is omitted when conducting the inventive process schematically illustrated in FIGS. 1–7. The resulting air tunnels formed without dielectric liner 21 exhibit a dielectric constant approximating 1.0. In the embodiment wherein a dielectric liner is employed, the dielectric constant is substantially reduced and depends, in part, upon the thickness of the liner.

According to the present invention, the intra-conductive layer capacitance of a semiconductor device is reduced by providing air tunnels in the interwiring spacings of a conductive pattern preferably wherein the interwiring spacing is less than about 1 micron, most preferably between consecutive conductive lines. The present invention is not limited to any particular type of conductive, dielectric or insulating material. Rather any conductive, dielectric or insulating material conventionally employed in the manufacture of semiconductor devices can be employed in the present invention and deposited in a conventional manner. The present invention advantageously reduces the intra-conductive layer capacitance thereby increasing the control speed of a semiconductor device.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

We claim:

1. A method of manufacturing a semiconductor device comprising:

forming an insulating layer on a substrate;

forming a conductive pattern on the insulating layer, wherein the conductive pattern comprises conductive lines separated by interwiring spaces;

depositing a dielectric liner in the interwiring spaces in which air tunnels are formed to cover the conductive lines and substrate;

depositing spin on glass in the interwiring spaces in which air tunnels are to be formed and on the conductive lines, and curing the deposited spin on glass;

depositing a dielectric capping layer on and across the dielectric liner and across the interwiring spaces filled with spin on glass;

selectively positioning a mask at locations of the conductive pattern having an interwiring spacing of less than about 1 micron, wherein the mask contains at least two openings for defining locations at the beginning and end of air tunnels;

etching to remove spun on glass, thereby forming air spaces in the interwiring spaces; and depositing a dielectric layer over the air spaces thereby forming air tunnels in the interwiring spaces of less than about 1 micron.

2. The method according to claim 1, wherein the conductive pattern is formed by depositing a conductive layer and anisotropically etching to form the conductive pattern.

3. The method according to claim 1, wherein the dielectric liner comprises silicon dioxide.

4. The method according to claim 1, wherein the dielectric liner has a thickness of about 500 Å to about 2500 Å.

5. The method according to claim 1, comprising depositing the dielectric liner by plasma enhanced chemical vapor deposition.

6. The method according to claim 5, further comprising sputter etching the plasma enhanced chemical vapor deposited dielectric liner to form the interwiring spaces.

7. The method according to claim 6, further comprising redepositing a dielectric layer of about 1000 Å to about 2500 Å, subsequent to sputter etching, by plasma enhanced chemical vapor deposition.

8. The method according to claim 1, further comprising etching back to remove spun on glass from locations of vias.

9. The method according to claim 1, comprising depositing the dielectric capping layer by plasma enhanced chemical vapor deposition.

10. The method according to claim 1, wherein the capping layer has a thickness of about 1000 Å to about 2000 Å.

11. The method according to claim 1, wherein the capping layer comprises silicon dioxide.

12. The method according to claim 1, further comprising:
dry etching to create openings in the capping layer under the mask openings; and
wet etching to remove spun on glass, thereby forming the air spaces in the interwiring spaces.

13. The method according to claim 12, wherein dry etching comprises reactive ion etching.

14. The method according to claim 12, wherein wet etching comprises etching with a buffered HF solution.

15. The method according to claim 14, wherein the buffered HF solution comprises at least 130 parts of water per part of HF and 7 parts of ammonium fluoride.

16. The method according to claim 1, wherein the dielectric layer comprises silicon dioxide.

17. The method according to claim 1, comprising depositing the dielectric layer by plasma enhanced chemical vapor deposition.

18. The method according to claim 1, wherein the dielectric layer has a thickness of about 2 microns.

19. The method according to claim 1, further comprising planarizing the dielectric layer.

20. The method according to claim 19, comprising planarizing the dielectric layer by chemical-mechanical polishing.

21. The method according to claim 1, comprising forming air tunnels in interwiring spaces between consecutive conductive lines.

22. A method of manufacturing a semiconductor device comprising:
forming an insulating layer on a substrate;
forming a conductive pattern on the insulating layer, wherein the conductive pattern comprises conductive lines separated by interwiring spaces; and
selectively forming air tunnels in interwiring spaces of less than about 1 micron between consecutive conductive lines in a plurality of separate sections.

23. The method according to claim 22, wherein the distance between each section containing air tunnels in interwiring spaces between consecutive conductive lines is about 10 to about 100 microns.

24. The method according to claim 1, further comprising forming a plurality of levels of insulating material, and forming a conductive pattern on each level.

25. The method according to claim 24, further comprising forming at least one conductive via to effect electrical connection between conductive patterns on different levels.

26. The method according to claim 24, comprising forming a conductive pattern with air tunnels in interwiring spaces between consecutive conductive lines on a plurality of levels of insulating material.

27. The method according to claim 1, wherein the conducive pattern comprises a material selected from the group consisting of refractory materials, aluminum, aluminum alloys, copper, copper alloys, tungsten, tungsten alloys and polycrystalline silicon.

28. The method according to claim 1, wherein the insulating material comprises a material selected from the group consisting of oxides, nitrides, oxynitrides, polyimides and polymeric material.

29. The method according to claim 23, wherein the distance between each section containing air tunnels in interwiring spaces between consecutive conductive lines is about 20 microns.

* * * * *

UNITED STATES PATENT AND TRADEMARK OFFICE
CERTIFICATE OF CORRECTION

PATENT NO. : 5,843,836
DATED : December 1, 1998
INVENTOR(S) : Robin W. CHEUNG et al It is certified that error appears in the above-identified patent and that said Letters Patent is hereby corrected as shown below:

In the Claims, Claim 27, Lines 30-31, change "conducive" to --conductive--

Signed and Sealed this

Twenty-third Day of March, 1999

Attest:

Q. TODD DICKINSON

Attesting Officer

Acting Commissioner of Patents and Trademarks